United States Patent
Chen (10) Patent No.: US 7,436,760 B2
(45) Date of Patent: Oct. 14, 2008

(54) METHOD FOR READING SENSOR (75) Inventor: Shih-Huang Chen, Hsin-Chu (TW)

(73) Assignee: Transpacific IP, LLP, Taipei (TW)

( * ) Notice: Subject to any disclaimer, the term of this patent is extended or adjusted under 35 U.S.C. 154(b) by 953 days.

(21) Appl. No.: 10/644,923

(22) Filed: Aug. 21, 2003

(65) Prior Publication Data
US 2005/0041490 A1  Feb. 24, 2005

(51) Int. Cl.
*H04J 11/00* (2006.01)
(52) U.S. Cl. ............. 370/208; 358/514; 250/208.1
(58) Field of Classification Search .......... 370/208, 370/209, 210, 218, 236, 247, 292, 324, 349, 370/382, 471; 365/200; 358/514, 513, 482, 358/483; 250/208.1
See application file for complete search history.

(56) References Cited

U.S. PATENT DOCUMENTS 4,855,981 A * 8/1989 Kimura et al. ........... 369/44.11

FOREIGN PATENT DOCUMENTS

CN  1298154  6/2001

* cited by examiner

*Primary Examiner*—Chi H. Pham
*Assistant Examiner*—Alexander Boakye
(74) *Attorney, Agent, or Firm*—Stolowitz Ford Cowger LLP (57) ABSTRACT

A method for reading sensor that stores data in numerous separate memory cells, such as 1-D linear sensor or 2-D sensor composed of some 1-D linear sensor. To read the sensor, initially receiving a parameter which is a positive integer N, then skipping some former memory cells, finally starting to read following memory cells behind the (N−1)th memory cell.

24 Claims, 7 Drawing Sheets

METHOD FOR READING SENSOR

BACKGROUND OF THE INVENTION

1. Field of the Invention

The present invention relates to a method for reading sensor. More particularly, the present invention relates to a method for reading sensor that stores data in numerous memory cells that are independent from each others.

2. Description of the Prior Art

A variety of sensors have been applied popularly in modern industry and manufactures, such as image sensors, alcohol sensors, photoelectric switches and the like. Generally, except sensors only for detecting the existence of objects, all sensors for sensing contents of objects comprise a plurality of sensing units for sensing and a plurality of memory cells for storing the sensed data. Of course, sensing units and memory cells can be separated; or initially combining one sensing unit and one memory cell as a basic unit, and then combine a plurality of basic units to be a whole sensor.

Figure 1A:
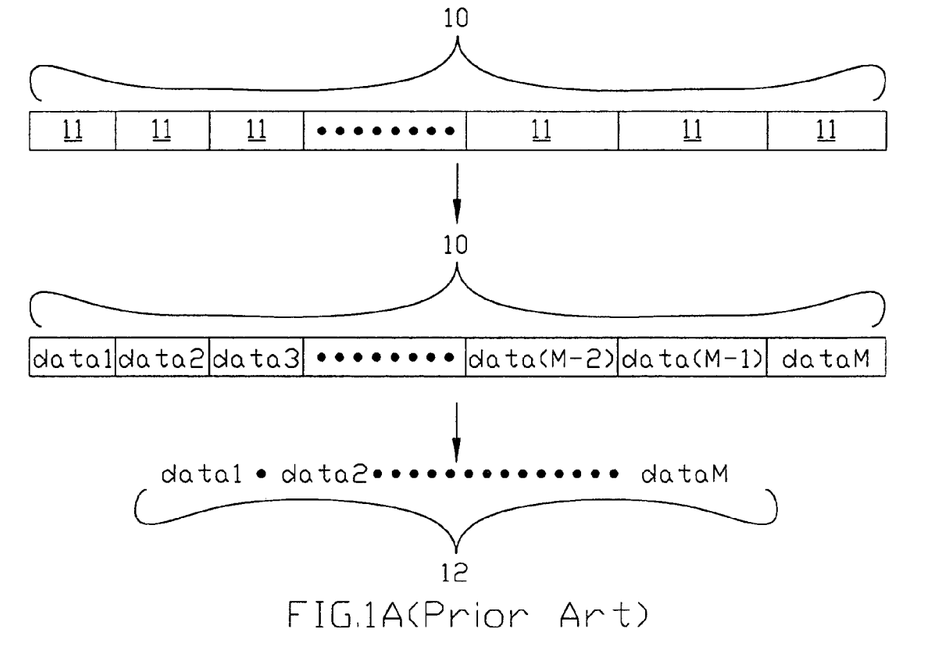
FIG. 1A to FIG. 1C are flow charts and diagram of the prior art.

In prior arts, all sensed data are stored in memory cells. Thus, the way for reading sensor is to read the contents of all cells from the first one. Referring to FIG. 1A, initially prepare the sensor 10 with M memory cells 11; then use sensor 10 to sense a certain object to make each memory cell 11 store a data (data1, data2, . . . data M); finally one by one read out the data composed of data1, data2, . . . until data M. For instance, use shift register to record charge movement within all basic units of a image sensor by using CCD (charge-coupled device), wherein read restored data in each basic unit sequentially from the first one.

However, considering somewhat application of sensors, frequently only parts of memory cells stores non-zero signals and users may need (or interest in) some parts of sensed contents rather than the whole one during sensing the content of a certain object. Thus the prior art is usually inefficient.

Figure 1B:
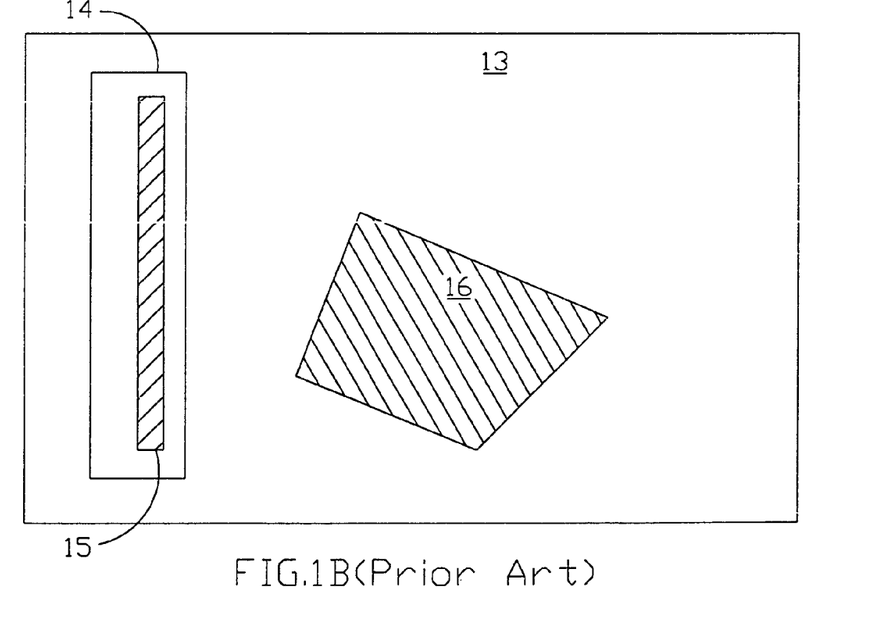
Figure 1C:
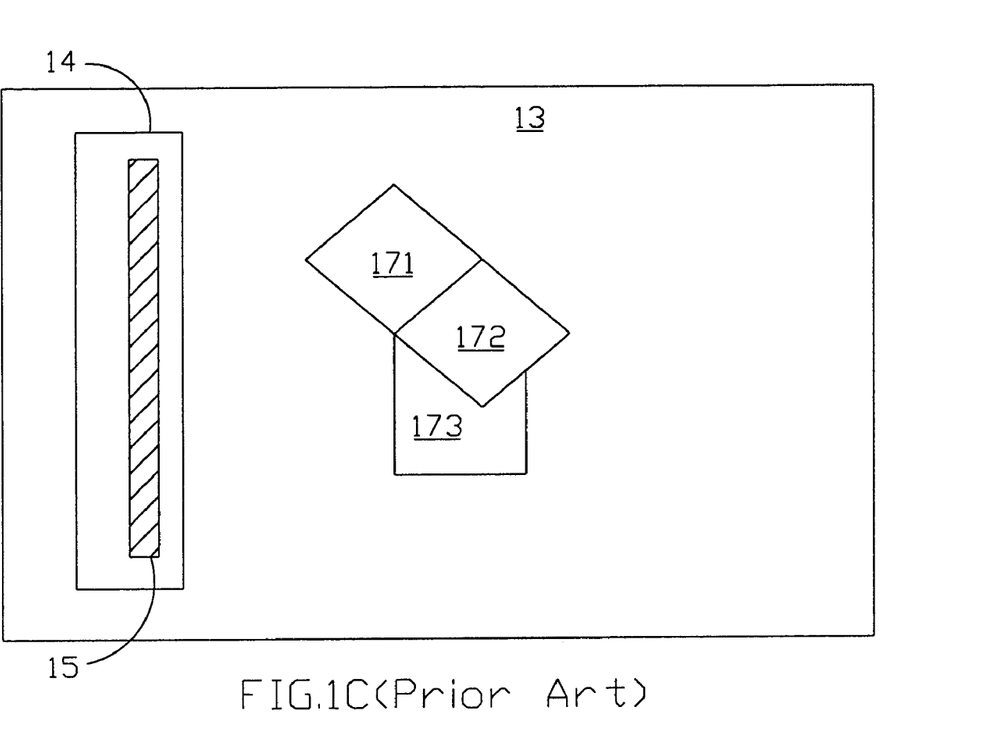

Referring to FIG. 1B and FIG. 1C, for example, considering photoelectric sensor 15 in the scanning head 14 of a scanner, the length of the object 16 parallel with the photoelectric sensor 15, waiting for being scanned, is possibly smaller than the length of the photoelectric sensor 15. A user may interest in a certain part of image (172) of the object rather than the whole image (171, 172, 173). Thus, in the prior arts, it is obviously not efficient that the user must read the whole data in the photoelectric sensor 15 to acquire and to deal with demanded partial data.

Therefore, it is necessary to develop a new method for reading sensor to let the user more efficiently read demanded data.

SUMMARY OF THE INVENTION

It is one object of the present invention to resolve the defects of the prior arts and to provide a method for reading sensor more efficiently.

It is another object of the present invention to provide a method for reading data in all memory cells sequentially started from the beginning without changing the specification of the present sensors.

It is a further object of the present invention to provide a method for reading data in all memory cells sequentially from the beginning with the premise not to change the format for storing data.

The present invention comprises one or more of the following features:

(1) Sensors adapting to each basic unit (at least each memory cell) is independent from each other;

(2) Proceeding reading, initially receive a parameter (positive integer) and number these units sequentially, then ignore those units with number smaller than the parameter and start to read all other units from the unit with number equal to the parameter.

(3) Proceeding reading, initially receive a parameter and an attached parameter, then stop reading sensor until the unit with number equal to the attached parameter (Namely, only read units with number between the parameter and the attached parameter.).

(4) The assignment of the parameter and the attached parameter can be user-defined, the parameters of sensors and determination in the process of sensing according to stored contents.

(5) Before proceed reading, only read units between the specific units corresponding to these parameters during sensor reading, i.e. read two specific units and units between these two units, and pair these specific units off from the first one of the specific units.

DESCRIPTION OF THE PREFERRED EMBODIMENT

Figure 2A:
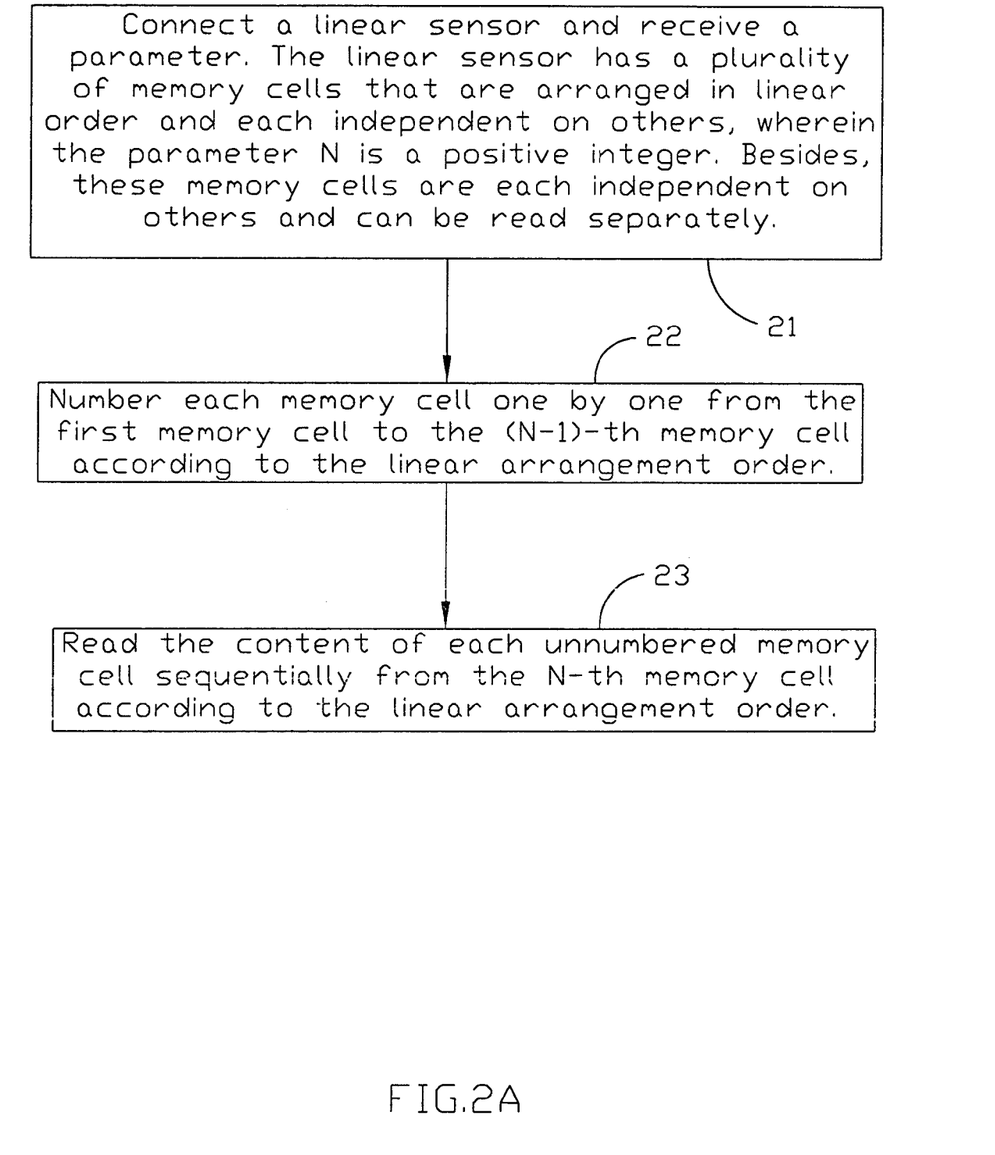
FIG. 2A to FIG. 2C are flow charts of a first embodiment of the present invention.

FIG. 2A is a method for reading sensor according to a first embodiment of the present invention, which comprises the following steps:

Referring to step 21, connecting a linear sensor and receiving a parameter. The linear sensor has numerous memory cells that are arranged in linear order and each independent on others, wherein the parameter N is a positive integer. Besides, these memory cells are each independent on others and can be read separately, e.g. CMOS memory cells.

Referring to step 22, numbering each memory cell one by one from the first memory cell to the (N−1)-th memory cell according to the linear arrangement order.

Referring to step 23, reading the content of each unnumbered memory cell sequentially from the N-th memory cell according to the linear arrangement order.

Figure 2B:
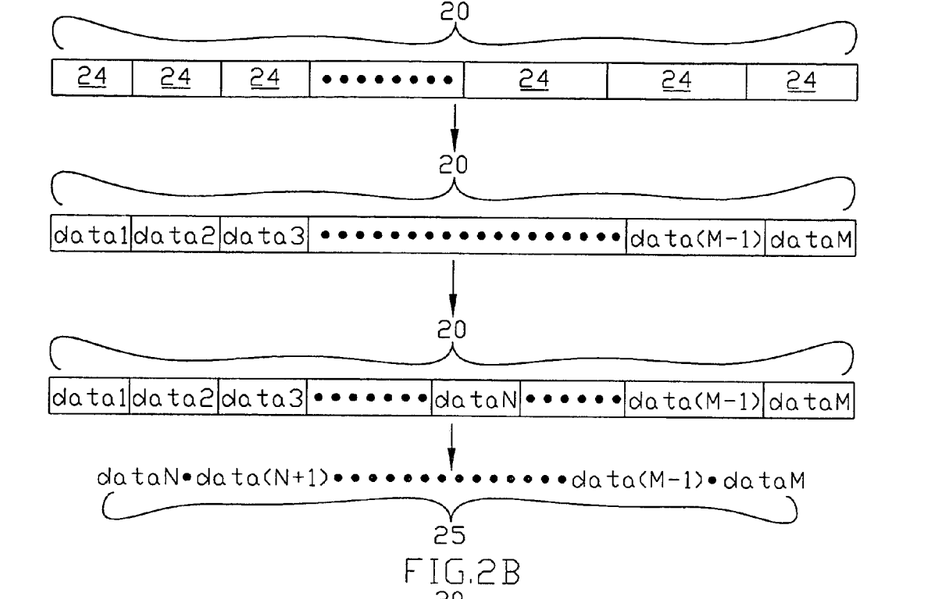

The first embodiment also can be described as FIG. 2B. At initial, preparing a sensor 20 with M memory cells 24; then using sensor 20 to sense a certain object to make each memory unit 24 to store a data (data 1, data 2, . . . data M); finally receiving parameter N first and then read the actually demanded data composed from data N, data N+1, . . . data M.

Obviously, one feature of the first embodiment is to receive parameter N first and then to read data N, data N+1, . . . data M stored in the memory cells with number not smaller than N one by one from the memory cell with number N.

Comparing to the prior art, the first embodiment does not read the data in the memory cells with number between 1 and N−1. When the data stored in the memory cells with number between 1 and N−1 is zero or is not user-demanded (i.e. the situation referring to FIG. 1B and FIG. 1C), the first embodiment can omit the time from reading or storing unnecessary data from the memory cells and can improve the performance of reading sensor.

Of course, in the first embodiment, parameter N is usually not a permanent value and is changeable. For instance, a new N can be generated prior to whenever a sensor is to be read. Generally, the parameter can be set up by manually input before reading the linear sensor; it also can be generated automatically by the linear sensor, i.e. it can be generated depending on the software inner default rules and the sensed value; and it can be a specific memory cell of the linear sensor stored the first nonzero signal.

The situation referring to FIG. 1C, sometimes some of these memory cells not only from the start but also at the end do not store meaningful (or user-demanded) data. However, only some parts within these memory cells store meaningful (or user-demanded) data. Therefore, the feature of the first embodiment to read the memory cell corresponding to the parameter and the later memory cells of it can be taken one step ahead to expand. That is not only to just read the memory cell corresponding to the parameter and later memory cells of it but also to read only the memory cell corresponding to another parameter and the memory cells prior to it Namely, referring to FIG. 2C, the first embodiment can be modified to prepare the sensor 20 with M memory cells 24 initially; then using sensor 20 to sense a certain object, whereby make each memory cell 24 to store a data (data 1, data 2, ... data M); finally receiving parameters N and L first and read the actually demanded data 25 composed with data N, data N+1, ... data L sequentially, wherein L is larger than N.

Figure 2C:
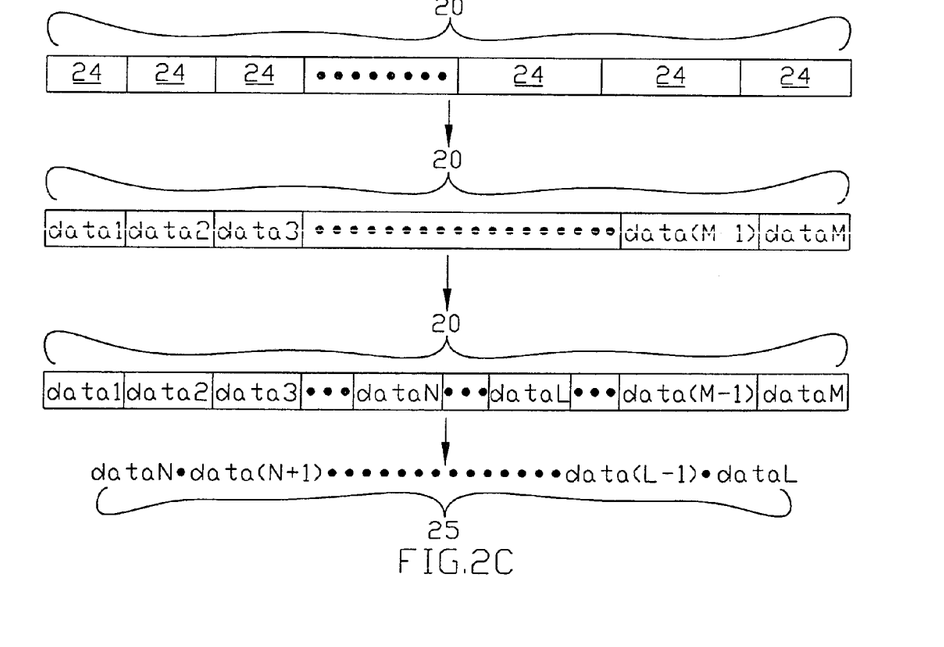

In other words, the first embodiment can receive attached parameter L at the same time to receive parameter N, wherein L is a positive integer larger than N, and read the contents of the memory cells between the memory cells corresponding to N and L one by one depending on the linear arrangement order. After reading L-th memory cell of the linear sensor, stop reading the remaining memory cells unnumbered yet. Generally, the attached parameter can be set up by manually input before reading linear sensor; it also can be generated automatically by the linear sensor, i.e. it can be generated depending on the software inner default rules and the sensed value; and it can be a specific memory cell of the linear sensor stored the first nonzero signal.

Because the first embodiment only relates to the memory cells that must have a fixed arrangement order and each of them can be read independently, the first embodiment does not relate to the detail (i.e. the detail and the relative position of each memory cell) of sensors.

Figure 3A:
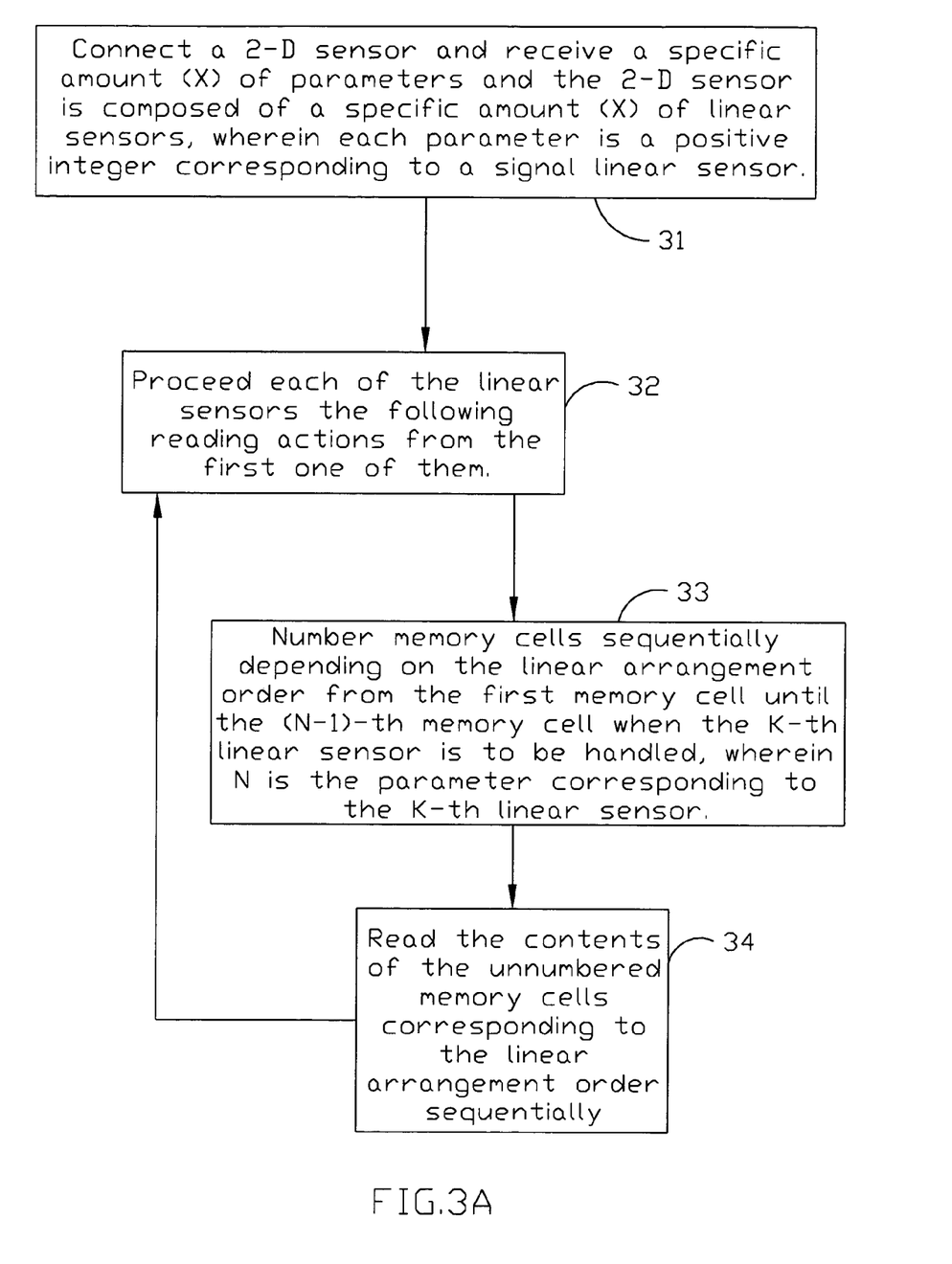
FIG. 3A is a flow chart of a second embodiment of the present invention.

FIG. 3A is a flow chart of a second embodiment of the present invention, which comprises the following steps:

Referring to step 31, connecting a 2-D sensors and receiving a specific amount (X) of parameters and the 2-D sensor is composed of a specific amount (X) of linear sensors, wherein each of the linear sensors has a plurality of memory cells that are each independent on others and can be read separately, wherein each parameter is a positive integer corresponding to a signal linear sensor.

Referring to step 32, proceeding the following reading actions for each of the linear sensors from the first one of them.

Referring to step 33, numbering memory cells sequentially depending on the linear arrangement order from the first memory cell until the (N−1)-th memory cell when the K-th linear sensor is to be handled, wherein N is the parameter corresponding to the K-th linear sensor.

Referring to step 34, reading the contents of the unnumbered memory cells corresponding to the linear arrangement order sequentially.

Obviously, a 2-D sensor can be considered as the combination of a plurality of 1-D linear sensors. Thus, the second embodiment basically repeats the proceedings of the first embodiment several times, the difference is that the first embodiment accepts only one parameter and the second embodiment accepts many parameters. If some linear sensors contain meaningful (or user-demanded) data in all memory cells, the parameters corresponding these linear sensors are zero. Of course, the format of the parameters can be variable. The format can be interlaced arranged with the numbers of linear sensors and the parameters, or it can be the numbers and the parameters of linear sensors not needed to be read from the first. The second embodiment is not limited by these details.

Figure 3B:
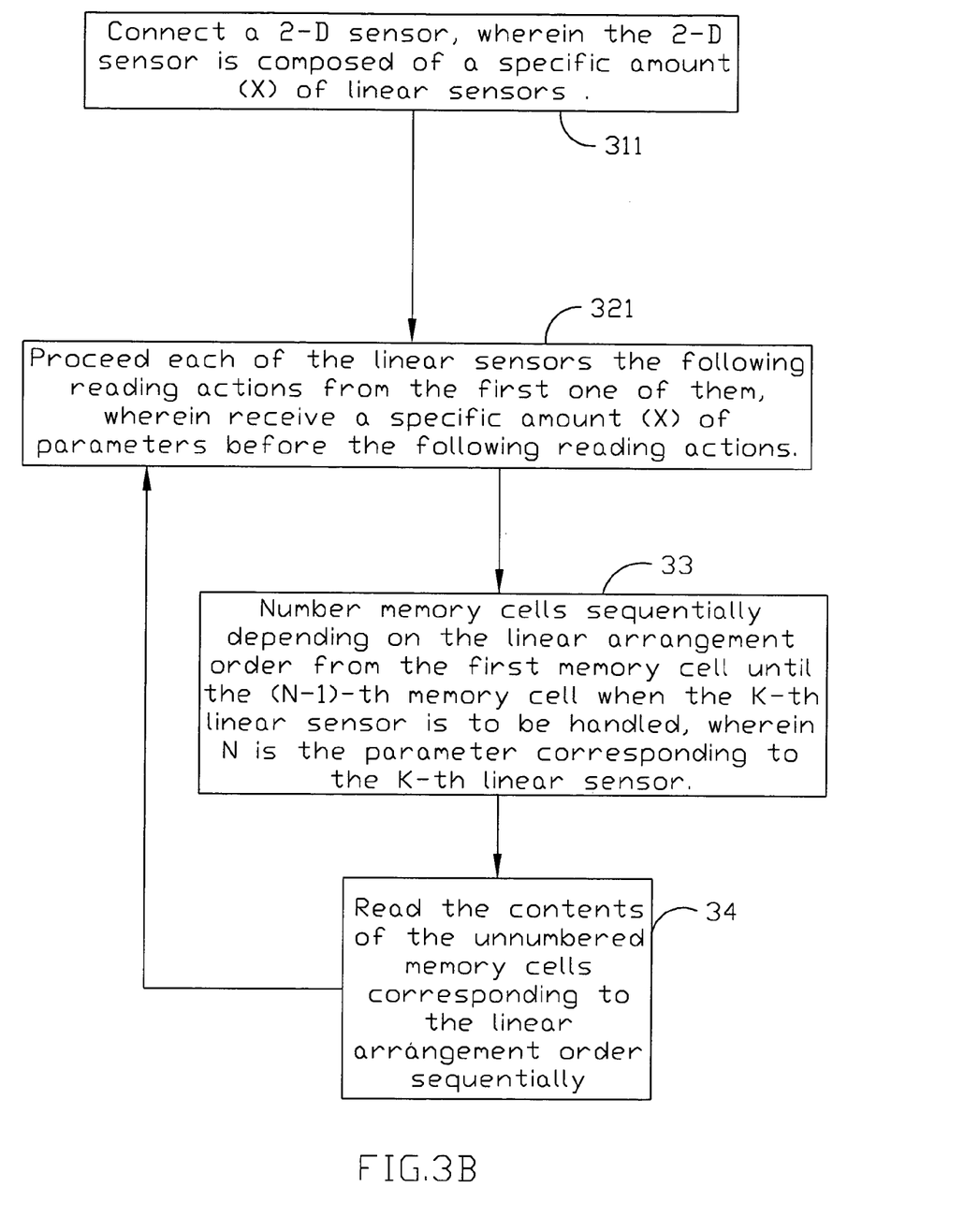
FIG. 3B is a flow chart of a third embodiment of the present invention.

Certainly, in the second embodiment, the memory cell to be read first will be amended according to the corresponding parameter whenever a linear sensor is to be read. How long ago the parameter is received is not important. Though FIG. 3A shows that all parameters are received first and then each linear sensor is handled sequentially, the second embodiment can be to receive the corresponding parameter whenever a linear sensor begins to be handled. Referring to FIG. 3B, a third embodiment of the present invention, merely replacing the step 31 and step 32 with a step 311 and step 321.

Owing to the other detail of the third embodiment is the same as the second embodiment, such as corresponding the attached parameter to stop reading a certain linear sensor, no more redundant statement of the detail is made.

The features of the second and third embodiments that are "to only read data of memory cells with number not smaller than the parameter" and "to only read data of memory cells with number not larger than the attached parameter" can further expand to read only some memory cells marked by some parameters.

Figure 4:
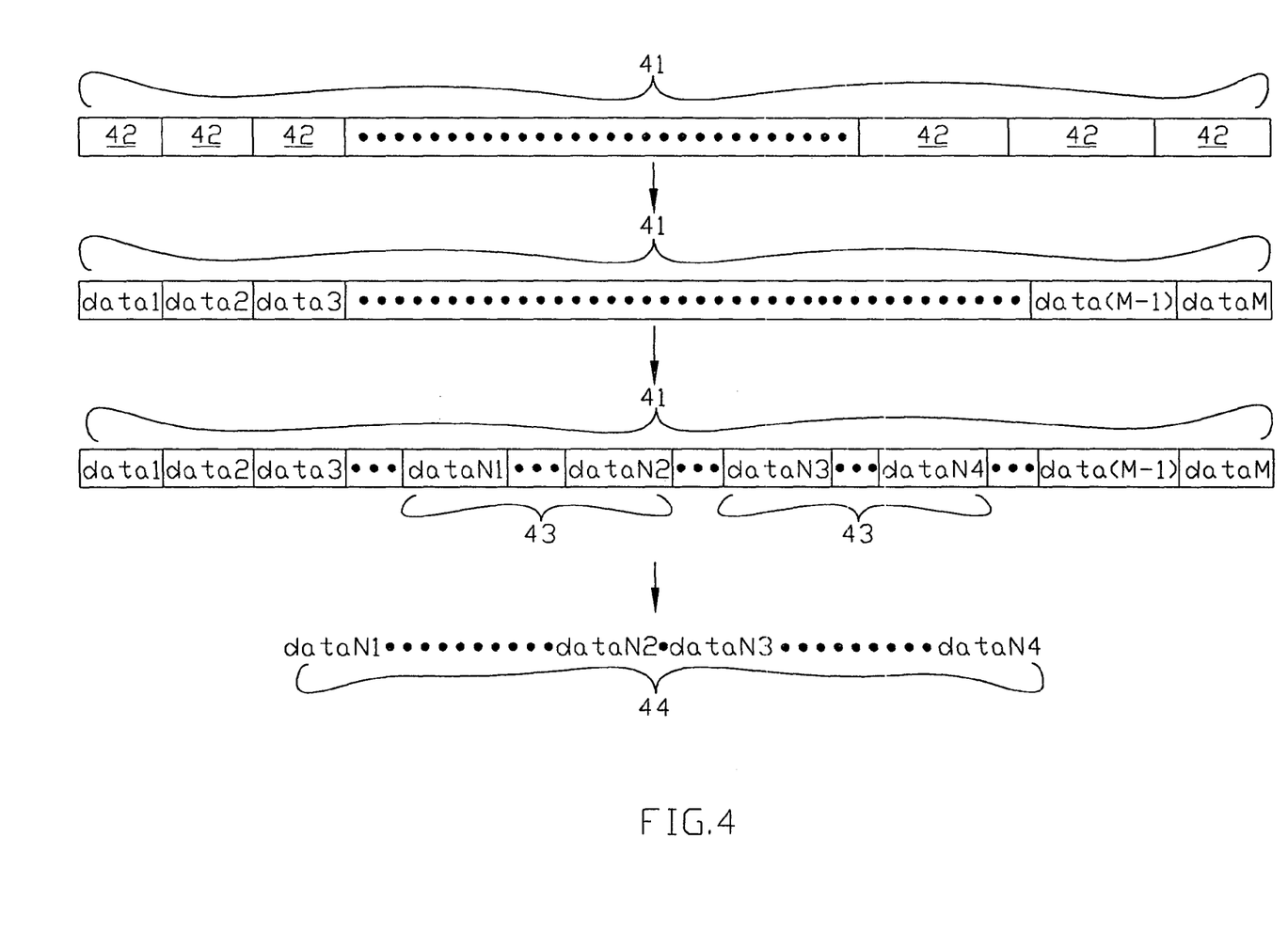
FIG. 4 is a flow chart of a fourth embodiment of the present invention.

Referring to FIG. 4, which is a fourth embodiment of the present invention. Before reading a certain linear sensor 41 of the sensor, receiving a plurality of parameters (N1, N2, ... Nn) first, then finding out n specific memory cells 42 with number corresponding to these parameters in the linear sensor 41. Pairing these specific memory cells 42 off from the first specific memory cell 42, and each pair of specific memory cells 42 marks a specific memory cell division 43. Finally reading out the stored data 44 of each specific memory cell division 43.

The situation referring to FIG. 4 is just inputted even parameters. The fourth embodiment takes advantage of a plurality of parameters to mark some specific divisions ready for reading and a specific division can be in the start of the first memory cell or in the end of the last memory cell. However, the fourth embodiment can also receive odd parameters.

Owing to the other detail of the second and third embodiments is the same as the fourth embodiment, i.e. all are suitable for 1-D or 2-D sensors, no more redundant statement of the detail is made.

The preferred embodiments are only used to illustrate the present invention; it is not intended to limit the scope thereof. Many modifications of the embodiments can be made without departing from the spirit of the present invention.

What is claimed is:

1. A method, comprising:
scanning an image with a plurality of sensing units;
storing the scanned data associated with the image to a plurality of memory cells;

receiving a starting parameter to identify at least one of the memory cells storing data associated with the scanned image;

sequentially reading the data stored in one or more of the memory cells, beginning with the memory cell identified by the starting parameter;

receiving an ending parameter to identify another one of the memory cells; and sequentially reading data from one or more of the memory cells, beginning with the memory cell identified by the starting parameter and finishing with the memory cell identified by the ending parameter.

2. The method of claim 1, wherein said memory cells are each independent from other said cells and are read separately.

3. The method of claim 1, wherein said starting parameter is set by manually input when a linear sensor is needed to be read.

4. The method of claim 1, wherein starting parameter is automatically generated by a linear sensor.

5. The method of claim 1, wherein starting parameter corresponds to a specific memory cell that is the first one of said memory cells stored nonzero signal when a linear sensor is sensing an object.

6. The method of claim 1 further includes setting the ending parameter according to a manual input.

7. The method of claim 1 wherein the linear sensor automatically generates the ending parameter.

8. A method comprising:
receiving a parameter N, wherein a linear sensor has a plurality of memory cells arranged in linear order and each said cell is independent from other said cells, and said parameter N is a positive integer;

numbering said memory cells sequentially from a first memory cell to a (N−1)-th memory cell depending on the linear arrangement order; and reading the contents of the unnumbered memory cells sequentially from the N-th memory cell, wherein an attached parameter L can also be received at the same time to receive said parameter N, and L is a positive integer larger than N, wherein by way of said attached parameter to stop reading unnumbered memory cells after reading the L-th one of memory cells in the linear arrangement order.

9. The method of claim 8, wherein said attached parameter is set by manually input when said linear sensor is needed to be read.

10. The method of claim 8, wherein said attached parameter is one of said parameters of said linear sensor.

11. The method of claim 8, wherein said attached parameter is a specific memory cell stored the last nonzero signal when said linear sensor is sensing an object.

12. A method comprising:
receiving a specific amount of parameters, wherein a 2-D sensor is composed of a specific amount of linear sensors, and each said linear sensor has a plurality of memory cells arranged by linear order and each parameter is a positive integer corresponding to a single linear sensor; and numbering said memory cells sequentially depending on linear arrangement order from a first memory cell until a (N−1)-th memory cell, wherein N is said parameter corresponding to said linear sensor; and reading contents of said memory cells that are unnumbered in linear arrangement order sequentially.

13. The method of claim 12, wherein each said memory cell is independent from other said cells and are read separately.

14. The method of claim 13, wherein each said parameter is set by manual input when said 2-D sensor is needed to be read.

15. The method of claim 13, wherein each said parameter is automatically generated by corresponding said linear sensor.

16. The method of claim 13, wherein each said parameter is a specific memory cell that is a first one of said memory cells storing nonzero signal when corresponding said linear sensor is sensing an object.

17. The method of claim 13, wherein a plurality of attached parameters can be received at the same time, wherein each of said attached parameter is an integer larger than the corresponding parameters.

18. The method of claim 17, wherein each of said linear sensors corresponds to a specific one of said parameters, but it is not necessary that each of said linear sensors corresponds to a specific one of said attached parameters.

19. The method of claim 17, wherein each of a certain specific linear sensor corresponds to a certain specific said attached parameter K; and stopping reading said memory cells after reading a K-th one of said memory cells when said linear sensor is reading the contents of said unnumbered memory cells sequentially.

20. The method of claim 17, wherein a source of any attached parameter comprises at least one of:
manual input to read said 2-D sensor,
automatic generation by said linear sensor, or
a last specific one of said memory cells storing a nonzero signal when said linear sensor is sensing an object.

21. A method, comprising:
receiving a plurality of parameters, wherein a linear sensor has a plurality of memory cells arranged in linear order and each said memory cell is independent from others, and each of said parameters is a positive integers;

numbering said memory cells sequentially from a first memory cell of said linear sensor depending on linear arrangement order sequentially to find out a plurality of specific memory cells with numbers equal to said parameters, wherein said specific memory cells are paired off and each pair of said specific memory cells marks a specific memory cell section; and reading said specific memory cell sections sequentially depending on linear arrangement order.

22. The method of claim 21, further includes
determining the range of said specific memory cell sections when the amount of said parameters is odd, wherein the determining comprises:

choosing a first memory cell and a first one of said specific memory cells to be a specific memory cell section and pairing the other specific memory cells off; and choosing a last one of said specific memory cells and a last memory cell to be a specific memory cell section and pairing the other specific memory cells off.

23. A device comprising: a linear sensor having a plurality of sensing units, configured in a linear arrangement, to detect at least one object; and a plurality of memory cells to store the detected data associated with the object and allow sequential access to the stored data according to the linear arrangement of the sensing units and a starting parameter, the starting parameter to identify which memory cell is first in a sequence of memory cells to be read; wherein the memory cells allow sequential access to the stored data according to the linear arrangement of the sensing units, the starting parameter, and an ending parameter, the ending parameter to identify which memory cell is last in the sequence of memory cells to be read.

24. A system comprising: means for scanning an image with a plurality of sensing units; means for storing the scanned data associated with the image to a plurality of memory cells; means for receiving a starting parameter to identify at least one of the memory cells storing data associated with the scanned image; and means for sequentially reading the data stored in one or more of the memory cells, beginning with the memory cell identified by the starting parameter; wherein the memory cells allow sequential access to the stored data according to the linear arrangement of the sensing units, the starting parameter, and an ending parameter, the ending parameter to identify which memory cell is last in the sequence of memory cells to be read.

* * * * *

UNITED STATES PATENT AND TRADEMARK OFFICE
CERTIFICATE OF CORRECTION

PATENT NO. : 7,436,760 B2
APPLICATION NO. : 10/644923
DATED : October 14, 2008
INVENTOR(S) : Shih-Huang Chen Page 1 of 1

It is certified that error appears in the above-identified patent and that said Letters Patent is hereby corrected as shown below:

At column 4, line 64, please delete "method," and insert -- method --.

At column 6, line 10, please delete "storing" and insert -- storing a --.

Signed and Sealed this

Sixteenth Day of November, 2010

David J. Kappos
*Director of the United States Patent and Trademark Office*